United States Patent [19]

Hashimoto

[11] Patent Number: 4,466,115
[45] Date of Patent: Aug. 14, 1984

[54] FM STEREO SIGNAL DEMODULATOR

[75] Inventor: Masaru Hashimoto, Ayase, Japan

[73] Assignee: Tokyo Shibaura Denki Kabushiki Kaisha, Kanagawa, Japan

[21] Appl. No.: 95,385

[22] Filed: Nov. 19, 1979

[30] Foreign Application Priority Data

Dec. 25, 1978 [JP] Japan .................................. 53-160435

[51] Int. Cl.³ .............................................. H04S 1/00
[52] U.S. Cl. ......................................... 381/11; 381/10
[58] Field of Search ............. 179/1 GJ, 1 GM, 1 GE; 381/10, 11, 7

[56] References Cited

U.S. PATENT DOCUMENTS

| | | | |
|---|---|---|---|
| 3,617,641 | 11/1971 | Fiet | 179/1 GE |
| 3,634,626 | 1/1972 | Staley | 179/15 BT |
| 3,711,652 | 1/1973 | Metro | 179/1 GM |
| 3,752,934 | 8/1973 | Nakamura et al. | 179/1 GM |
| 3,825,697 | 7/1974 | Cornell et al. | 179/1 GJ |
| 4,032,717 | 6/1977 | Mallon | 179/15 BT |
| 4,146,747 | 3/1979 | Numata et al. | 179/1 GM |
| 4,194,087 | 3/1980 | Sakaida | 179/1 GM |

Primary Examiner—Douglas W. Olms
Attorney, Agent, or Firm—Oblon, Fisher, Spivak, McClelland & Maier

[57] ABSTRACT

An FM stereo signal demodulator for separating a composite stereo signal into left and right signals is disclosed wherein the amplitude of the 38 kHz signal necessary to separate the composite signal is varied in accordance with the field strength of a received signal.

8 Claims, 3 Drawing Figures

FM STEREO SIGNAL DEMODULATOR

BACKGROUND OF THE INVENTION

1 Field of the Invention

This invention relates to an FM stereo signal demodulator for separating a composite FM stereo signal into left and right signals. In particular, this invention relates to an FM stereo signal demodulator wherein the amplitude of the 38 kHz switching signal necessary to separate the composite signal into left and right signals is varied, thereby making it possible to alter the degree of left and right signal separation and to achieve a good signal to noise ratio (S/N) for received signals having a wide range of electric field strengths.

2 Description of the Prior Art

When an FM stereo signal is received and the electric field strength is somewhat higher than the limiting sensitivity of the receiver, stereo reception is adversely affected in signal to noise ratio by nearly 20 dB in comparison with monaurel reception. This difference in signal to noise ratio varies depending on the degree of separation of the composite stereo signal, the signal to noise ratio being worse the greater the degree of the separation.

Thus to obtain a good signal to noise ratio over a wide range of electric field strengths, the left and right signal separation should be controlled such that the separation is large when the electric field is strong, and such that the separation becomes smaller as the electric field strength becomes weaker.

SUMMARY OF THE INVENTION

Accordingly, it is an object of this invention to provide a novel FM stereo signal demodulator having a good signal to noise ratio over a wide range of received electric field strengths which varies the separation automatically in accordance with the electric field strength of the received signal.

It is yet another object of this invention to provide a novel FM stereo signal demodulator which varies the separation by varying the amplitude of the 38 kHz switching signal by detecting the output from the IF amplifier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
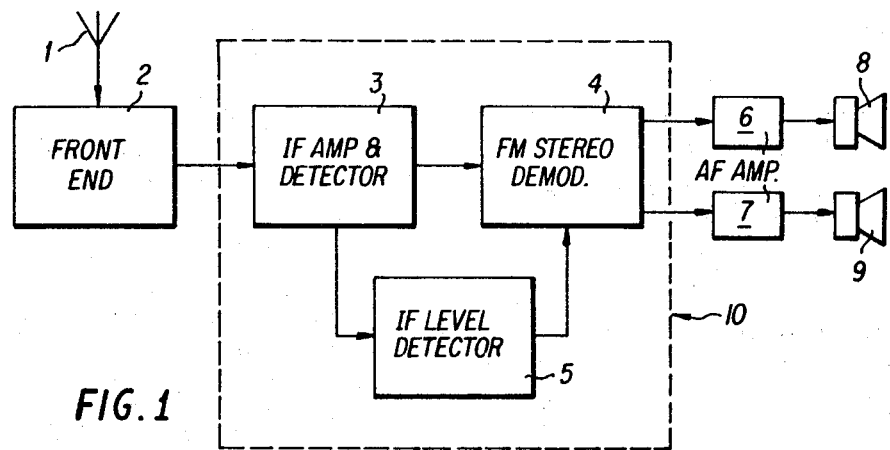
FIG. 1 is a block diagram of an FM stereo signal receiver including an FM stereo signal demodulator constructed in accordance with the present invention, as indicated by the part enclosed by the dotted lines.

Referring now to the drawings, wherein like reference numerals designate identical or corresponding parts throughout the several views, and more particularly to FIG. 1 thereof, wherein an FM stereo signal demodulator is constructed in accordance with this invention, the novel demodulator being enclosed by the dotted lines.

The FM carrier signal including the (L+R) signal, the AM suppressed carrier of 38 kHz modulated by the (L−R) signal, and the 19 kHz pilot signal is received at an antenna 1, and supplied to the front end circuit 2. This front end circuit 2 comprises a Radio Frequency Amplifier (RF Amp.), a Local Oscillator (osc), and a Mixer, all of which cooperate to convert the input signal to an intermediate frequency signal (IF). The IF signal is supplied to the next IF Amp. and FM detector 3, wherein the composite signal is detected. This composite signal is supplied to the FM stereo signal demodulator 4, while a part of the output from the IF amp. is supplied to the IF level detector 5. This IF level detector 5 developes a DC voltage in accordance with the IF signal, and supplies this DC voltage to the FM stereo signal demodulator 4. This output from the IF level detector 5 is used to control the separation of the demodulator 4. When the electric field strength of the received signal is high, this output is supplied to the demodulator 5 to make the separation great, and when the strength is weak the output is supplied to make the separation small. The left and right signals separated by the signal demodulator 4 are supplied to the Audio Frequency Amplifiers (AF Amp.) 6 and 7, and after being amplified are supplied to loud speakers 8 and 9.

Figure 2:
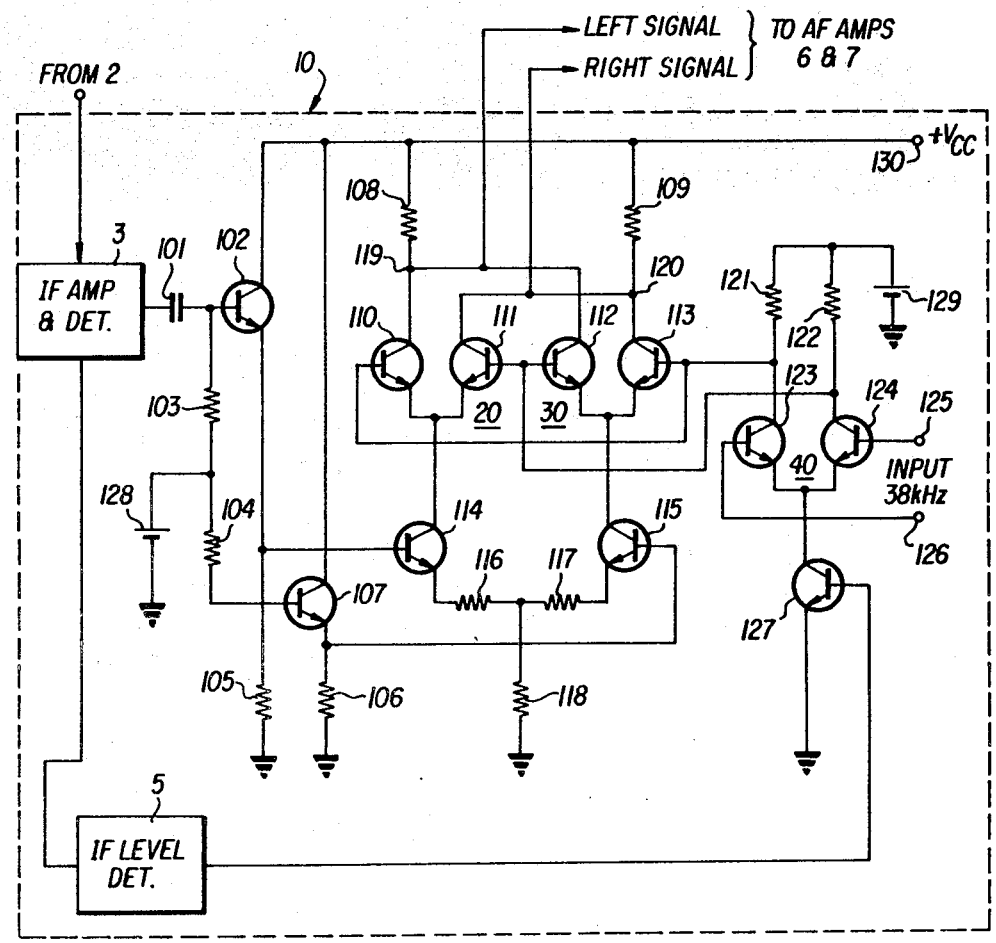
FIG. 2 is a preferred embodiment of the part enclosed by the dotted lines in the FIG. 1.

FIG. 2 shows a preferred embodiment of the novel demodulator enclosed by the dotted lines in FIG. 1.

The composite signal from the detector 3 is supplied to the base of transistor 102 operating as an emitter follower through the condenser 101. The emitter of the transistor 102 is grounded through a resistance 105, and the collector of transistor 102 is connected to the power supply terminal 130. The signal appearing at the emitter of transistor 102 is supplied to the base of first input transistor 114.

The DC bias source 128 is connected to the bases of transistors 102 and 107 through the resistances 103 and 104, respectively. As the junction of the resistances 103 and 104 is grounded to any alternating signal, the composite signal is not supplied to the base of transistor 115.

The emitter of the transistor 107 is grounded through the resistance 106, and the collector is connected to the power supply terminal 130. The collector of the first input transistor 114 is connected to the emitters of a pair of transistors 110 and 111 which are operated as a first synchronous demodulator 20. The collectors of these transistors are connected to the power supply terminal 130 through the resistances 108 and 109, respectively. On the other hand, the emitter of the transistor 114 is connected to the emitter of the second input transistor 115 though the resistances 116 and 117. The junction of resistances 116 and 115 is grounded through the resistance 118.

The collector of the second input transistor 115 is connected to the emitters of a pair of transistors 112 and 113 which are operated as a second synchronous demodulator 30. The collectors of these transistors are connected to the collectors of the transistors 110 and 111 respectively. Therefore, the outputs of the first synchronous demodulator 20 and the second synchronous demodulator 30 are added together. The left and right signals, which appear at the output terminals 119 and 120, are supplied to the AF Amps 6 and 7 (not shown) connected to these terminals respectively.

On the other hand, part of the output from the IF level detector 5 is supplied to the base of the third input transistor 127. The IF level detector 5 detects the output of the IF Amp. 3, and rectifies the output to produce a DC voltage. The IF level detector 5 supplies this DC voltage to the base of the third input transistor 127. Usually the output of an IF level detector is used to drive a Signal Strength Meter.

The emitter of the third input transistor 127 is grounded, and the collector is connected to the emitters of a pair of transistors 123 and 124 operating as a gate circuit 40. The collectors of these transistors 123 and 124 are connected to the DC voltage source 129 through the resistances 121 and 122, respectively. The bases of transistors 123 and 124 are supplied with the 38 kHz switching signal. this 38 kHz signal may be obtained from the 19 kHz pilot signal as doubled by a frequency doubler (not shown). The collector of the transistor 123 is connected to the bases of the transistors 110 and 113, and the collector of the transistor 124 is connected to the bases of the transistors 111 and 112. Therefore the transistors 110 and 113, or 111 and 112, are in the same conductive situation respectively. Namely when the transistors 111 and 112 are conductive, the transistors 110 and 113 are nonconductive and vice versa at the next half cycle of the 38 kHz switching signal. In operation, a synchronous demodulator of the type used as the demodulator 20 produces a substantially equal and predictable amount of undesirable crosstalk at each of the output terminals 119 and 120. The output of the first synchronous demodulator 20 is expressed by the following equations:

$$L_1 = L + \Delta R \quad (1)$$

$$R_1 = R + \Delta L \quad (2)$$

wherein $L_1$ is the output of the transistor 112, $R_1$ is the output of the transistor 113, L is the left signal component, R is the right signal component, and $\Delta R$, $\Delta L$ are crosstalk or small components of the R and L signals respectively.

On the other hand, the composite signal to be applied to the second synchronous demodulator 30 is supplied through the resistances 116, 117 and the second input transistor 115 from the emitter of the first input transistor 114. Therefore the composite signal to be supplied to the second demodulator 30 is out of phase with the composite signal to be supplied to the first synchronous demodulator 20. If the ratio of the composite signal at the collector of transistor 114 to the composite signal at the collector of transistor 115 is 1:1/k, the output of the second synchronous demodulator 30 can be expressed as:

$$L_2 = \frac{1}{k}(L + \Delta R) \quad (3)$$

$$R_2 = -\frac{1}{k}(R + \Delta L) \quad (4)$$

wherein $L_2$ and $R_2$ are signals which appear at the collectors of transistors 112 and 113, respectively, and K is a constant. Therefore the sum signals which appear at the output terminals 119 and 120 can be expressed as:

$$L_0 = (L + \Delta R) - \frac{1}{k}(R + \Delta L) \quad (5)$$

$$= \left(L - \frac{\Delta}{k}L\right) + \left(\Delta R - \frac{1}{k}R\right)$$

$$R_0 = (R + \Delta L) - \frac{1}{k}(L + \Delta R) \quad (6)$$

$$= \left(R - \frac{\Delta}{k}R\right) + \left(\Delta L - \frac{1}{k}L\right)$$

wherein $L_0$ appears at the output terminal 119 and $R_0$ appears at 120. Therefore, if $\Delta = 1/k$, $L_0$ and $R_0$ comprise only L or R signal components respectively. This adjustment of k can be done by controlling the value of resistances 116, 117 and 118.

In this situation, when the field strength of the received FM stereo signal, and therefore the output from the IF level detector 5 becomes weak, the collector of the third input transistor 127 becomes small. Therefore the collector currents of the transistors 123 and 124 also decrease and in consequence the 38 kHZ switching signal supplied to the first and second synchronous demodulators 20 and 30 becomes weaker. For example, because of the insufficiency of the 38 kHz switching signal, the switching operation of the transistors of the first and second synchronous demodulators becomes insufficient, and so the ratio of the collector current of the transistor 110 to 111, or 113 or 112 can be expressed as follows:

$$I_{c110}:I_{c111} = I_{c113}:I_{c112} = a:(1-a) \quad (7)$$

or $$I_{c110}:I_{c111} = I_{c113}:I_{c112} = (1-a):a \quad (8)$$

wherein $I_{c110}$, $I_{c111}$, $I_{c112}$ and $I_{c113}$ are the collector current of transistors 110, 111, 112 and 113, respectively, and a is a number lying within the range $0.5 \leq a \leq 1$.

In this situation the output which appears at the output terminal 119 when the ratio of the collector current is $I_{c110}:I_{c111} = a:(L-a)$ is as follows:

$$L_{01} = (L + \Delta R) \cdot a - \frac{1}{k} \cdot (L + \Delta R) \cdot (1-a) \quad (9)$$

$$= L \cdot \left(a - \frac{1}{k} + \frac{a}{k}\right) + R \cdot \left(\Delta a - \frac{\Delta}{k} + \frac{a}{k}\right)$$

Likewise, when $I_{c110}:I_{c111} = (1-a):a$, namely at the next half of the 38 kHz switching signal, $$L_{02} = (R + \Delta L) \cdot (1-a) - \frac{1}{k}(R + \Delta L) \cdot a \quad (10)$$

$$= L \cdot \left(\Delta - \Delta a - \frac{\Delta a}{k}\right) + R \cdot \left(-a - \frac{a}{k}\right)$$

is the result. The output or sum signal expressed by the equations (9) and (10) is:

$$L_0 = L_{01} + L_{02} \quad (11)$$

$$= L \cdot \left(a - \frac{1}{k} + \frac{a}{k} + \Delta - \Delta a - \frac{\Delta a}{k}\right) +$$

-continued $$R \cdot \left( \Delta a - \frac{\Delta}{k} + \frac{\Delta a}{k} + 1 - a - \frac{a}{k} \right)$$

$$= L \cdot a \cdot \left( 1 - \frac{\Delta}{k} \right) + R(1-a) \cdot \left( 1 - \frac{\Delta}{k} \right)$$

Likewise, the output which appears at the output terminal 120 is:

$$R_0 = R \cdot a \cdot \left( 1 - \frac{\Delta}{k} \right) + L(1-a)\left( 1 - \frac{\Delta}{k} \right) \qquad (12)$$

and the separation S is:

$$S = 20 \log_{10}\left( \frac{1-a}{a} \right) \; (dB) \qquad (13)$$

as is apparent in these equations, when a=1 perfect separation occurs, and the outputs are:

$$L_0 = L \cdot \left( 1 - \frac{\Delta}{k} \right) \qquad (14)$$

$$R_0 = R \cdot \left( 1 - \frac{\Delta}{k} \right) \qquad (15)$$

These equations can be obtained from the equations (5) and (6) also by using $\Delta = 1/k$.

On the other hand, when a=0.5, $$L_0 = 0.5L\left( 1 - \frac{\Delta}{k} \right) + 0.5R\left( 1 - \frac{\Delta}{k} \right) \qquad (16)$$

$$R_0 = 0.5R\left( 1 - \frac{\Delta}{k} \right) + 0.5L\left( 1 - \frac{\Delta}{k} \right) \qquad (17)$$

and the separation is 0 (dB).

The voltage difference between the collectors of transistors 123 and 124 is:

$$V_{BB38} = \frac{kT}{q} \ln \frac{I_2}{I_1} \qquad (18)$$

werein q is the charge of an electron, k is Boltzman's constant, T is absolute temperature, $I_1$ is the collector current of transistors 110, 113, and $I_2$ is the collector current of transistors 111, 112. When $$I_1 \cdot I_2 = a:(1-a) \qquad (19)$$

$$I_2 = \frac{1-a}{a} I_1 \qquad (20)$$

therefore from equations (20) and (18)

$$V_{BB38} = \frac{kT}{q} \ln \frac{1-a}{a} \qquad (21)$$

and thus the separation S is, from the equations (13) and (21), $$S = 20 \log_{10}\left( e^{\frac{q}{kT} V_{BB38}} \right) \qquad (22)$$

$$= 20 \cdot \frac{q}{kT} V_{BB38} \log_{10} e$$

$$= 8.68 \cdot \frac{q}{kT} V_{BB38} \; (dB)$$

Figure 3:
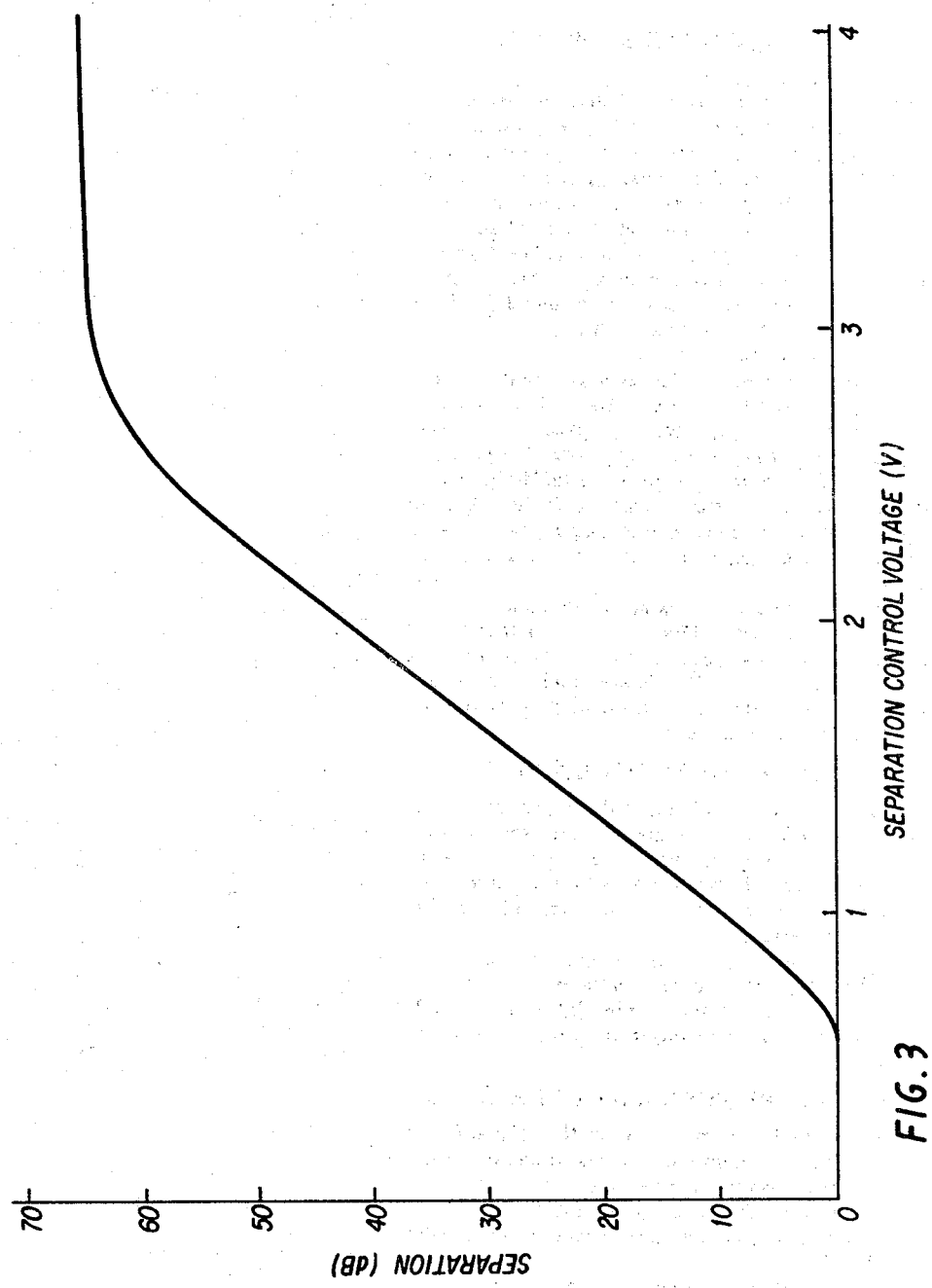
FIG. 3 is a graph showing the relationship between the output of the IF level detector 5 and the separation of the stereo signal demodulator.

This equation (22) means that the separation S varies in proportion to $V_{BB38}$. This relationship is shown in FIG. 3. Namely, FIG. 3 shows the relationship between the separation of the FM stereo signal demodulator and the separation control voltage to be supplied to the base of the transistor 127.

In the embodiment shown in FIG. 2, $V_{BB38}$ is varied by varying the voltage drop of the resistances 121 and 122 and by controlling the separation control voltage.

It is obvious that this invention is not limited to the circuit of this embodiment. The essentials are a demodulating circuit which, by means of a 38 kHz switching signal, separates an FM stereo signal (composite signal) into the left and right signals, and a means for varying the signal amplitude of the 38 kHz switching signal so that the degree of the left and right separation can be varied. Various additional applications of this are possible.

Obviously, additional modifications and variations of the present invention are possible in light of the above teachings. It is therefore to be understood that within the scope of the appended Claims, the invention may be practiced otherwise than as specifically discribed herein.

What is claimed as new and desired to be secured by letters patent of the Unites States is:

1. An FM stereo demodulator system for separating a composite stereo signal into left and right signals which comprises:
   intermediate frequency amplifier means for receiving and amplifying an intermediate frequency FM composite stereo signal;
   amplitude detector means for detecting the amplitude of the intermediate frequency output of said intermediate frequency amplifier means;
   composite stereo signal detector means for removing said composite stereo signal from the output of said intermediate frequency amplifier means;
   means for supplying a 38 kHz switching signal;
   means for varying the amplitude of said 38 kHz switching signal in proportion to the amplitude of said intermediate frequency FM signal as controlled by the output of said amplitude detector means; and
   demodulator circuit means coupled to receive the output of said composite stereo signal detector means for separating said composite stereo signal into left and right signals under control of said variable amplitude 38 kHz switching signal received from said amplitude varying means, wherein the stereo separation between said left and right signals is automatically varied in proportion to the amplitude of the FM composite stereo signal.

2. An FM stereo demodulator system for separating a composite stereo signal into left and right signals which comprises:

demodulating circuit means for separating said composite stereo signal into left and right signals by means of a 38 KHz switching signal;

means for supplying said 38 KHz switching signal;

means for supplying a stereo separation ratio control voltage to said 38 KHz switching signal sypplying means so as to control the amplitude of said 38 KHz switching signal, said stereo separation ratio control voltage having more than two levels; and means for varying the amplitude of said stereo separation ratio control voltage, whereby the stereo separation between said left and right signals is varied in proportion to the amplitude of said control voltage.

3. An FM stereo demodulator system as recited in claim 2 werein said amplitude detector means comprises:

circuit means for detecting the amplitude of the intermediate frequency output of said intermediate frequency amplifier means;

rectifier means for converting the ouput of said detector circuit means into a DC voltage; and means for supplying the DC voltage output of said rectifier means to said switching signal amplitude varying means.

4. An FM stereo demodulator system as recited in claim 2 wherein said demodulator circuit means comprises:

first and second input transistors, the first input transistor being supplied with the composite stereo signal output of said composite stereo signal detector means; and first and second synchronous demodulators, each having a pair of switching transistors supplied with signals from the first and second input transistors.

5. An FM stereo demodulator system as recited in claim 2 wherein said switching signal amplitude varying means comprises:

a first transistor having a base coupled to receive said 38 kHz switching signal;

a second transistor having its emitter coupled to the emitter of said first transistor, the base of said second transistor being coupled to receive a 38 kHz switching signal phase shifted by 180° from that received by said first transistor; and an input transistor having a collector coupled to the emitters of said first and said second transistors, the base of said input transistor coupled to receive the output of said amplitude detector means;

wherein said variable amplitude 38 kHz switching signal appears at the collectors of said first and second transistors.

6. An FM receiver comprising:

a demodulator circuit for reproducing a left-channel demodulated output and a right-channel demodulated output from a stereophonic composite signal and a switching signal of 38 KHz;

a signal feeding circuit including an output terminal which feeds said switching signal of 38 KHz to said demodulator circuit, said signal feeding circuit further including a control terminal and means coupled to said control terminal to control the signal level of said switching signal of 38 KHz at said output terminal; and a detector circuit for obtaining a detection signal corresponding to a level of the FM intermediate-frequency signal;

wherein said detection signal is fed to said control terminal of said signal feeding circuit as a control signal such that the signal level of the switching signal of 38 KHz fed from said signal feeding circuit to said demodulator circuit is gradually decreased by said signal level control means with the decrease in the level of said FM intermediate-frequency signal.

7. An FM receiver according to claim 6, wherein said means to control the signal level of said switching level of said switching signal of 38 KHz comprises:

means for decreasing the signal level of the 38 KHz switching signal in proportion to a decrease in the level of said FM intermediate-frequency signal which serves as said control signal.

8. An FM receiver comprising:

a demodulator circuit for reproducing a left-channel demodulated output and a right-channel demodulated output from a stereophonic composite signal and a switching signal of 38 KHz;

a signal feeding circuit including an output terminal which feeds said switching signal of 38 KHz to said demodulator circuit, said signal feeding circuit futher including a control terminal and means coupled to said control terminal to control the signal level of said switching signal of 38 KHz at said output terminal; and a detector circuit for obtaining a detection signal corresponding to a level of the FM intermediate-frequency signal;

wherein said detection signal is fed to said control terminal of said signal feeding circuit as a control signal such that the signal level of the switching signal of 38 KHz fed from said signal feeding circuit to said demodulator circuit continuously decreases over a substantial range of said control signal in correspondance with a decrease in the level of said FM intermediate-frequency signal.

* * * * *